United States Patent [19]

Chennakeshu et al.

[11] Patent Number: 5,349,589
[45] Date of Patent: Sep. 20, 1994

[54] GENERALIZED VITERBI ALGORITHM WITH TAIL-BITING

[75] Inventors: Sandeep Chennakeshu; Raymond L. Toy, both of Clifton Park, N.Y.

[73] Assignee: Ericsson GE Mobile Communications Inc., Research Triangle Park, N.C.

[21] Appl. No.: 724,280

[22] Filed: Jul. 1, 1991

[51] Int. Cl.$^5$ .............................................. G06F 11/10
[52] U.S. Cl. .................................... 371/43; 341/144; 371/49.1
[58] Field of Search ................ 371/43, 37.1, 49.1, 371/48; 341/144; 321/44, 45

[56] References Cited

U.S. PATENT DOCUMENTS

| | | | |
|---|---|---|---|
| 4,110,735 | 8/1979 | Maxemchuck . | |
| 4,747,104 | 5/1988 | Piret | 371/39.1 |
| 5,073,940 | 12/1991 | Zinser et al. | 381/47 |
| 5,105,442 | 4/1992 | Wei | 371/43 |
| 5,113,401 | 5/1992 | Chevillat et al. | 371/43 |
| 5,182,753 | 1/1993 | Dahlin et al. | 371/43 |

OTHER PUBLICATIONS

Qiang Wang et al. "An Efficient Maximum Likelihood Decoding Algorithm for Generating Tail Biting Convolution Codes" pp. 875–879 (IEEE Transactions).

G. D. Forney, Jr. "The Viterbi Algorithm." Proc. of the IEEE, 61:268–277 1973.

Howard Ma and Jack Wolf. "On tail biting convolutional codes." IEEE Trans. on Communications, COM-34, pp. 104–111, Feb. 1986.

N. Seshadri and C. E. W. Sundberg, "Generalized viterbi algorithms for error detection with convolutional codes." In IEEE Global Telecommunications Conference, pp. 1534–1538, Dallas, Tex. Nov. 27–30, 1989.

Andrew S. Tanenbaum. Computer Networks. Prentice-Hall, Inc., Englewood Cliffs, N.J., 1981. (Enclosed copy of title page, table of contents, and preface—pp. i–xv.).

Andrew Viterbi and Jim Omura. Principles of Digital Communications and Coding. McGraw-Hill, Inc. N.Y., 1979. (Enclosed copy of title page, table of contents, and preface—pp. i–xiii.).

Qiang Wang and Vijay Bhargava. "An efficient maximum likelihood decoding algorithm for generalized tail biting convolutional codes including quasicyclic codes." IEEE Trans. on Commun., COM-37:875–879, Aug. 1989.

Primary Examiner—Robert W. Beausoliel, Jr.
Assistant Examiner—Albert DeCady

[57] ABSTRACT

A method and apparatus for digital radio communication employs separation of a frame of data to be transmitted into key bits, critical bits and unprotected bits. The key bits are processed to provide parity bits. The parity bits, and key bits are convolutionally encoded using a tail-biting scheme and merged with unprotected bits, and then transmitted. At the receiver, the decoder splits the received data into convolutionally encoded bits and unprotected bits, and trellis decodes the convolutionally encoded bits into a number of possible paths through a trellis using a generalized Viterbi algorithm. The tail-biting scheme reduces the number of bits that must be transmitted. Paths having errors in the key bits are rejected, and the path having the best metric without key bit errors is used in decoding the transmitted information. In the event that there is no such path, a previously selected path is substituted and decoded.

5 Claims, 8 Drawing Sheets

GENERALIZED VITERBI ALGORITHM WITH TAIL-BITING

BACKGROUND OF THE INVENTION

1. Field of the Invention

This invention relates to digital radio communication channels and more specifically to error detection and correction in digital radio communication channels.

2. Description of Related Art

Noise is inherent in radio communication channels. Although this noise may not be much of a problem for analog voice communications systems, it creates problems for digital communications systems. The noise causes bit errors in the transmitted information. In order to combat the noisy channel, and hence reduce bit errors, digital cellular radio systems typically employ both error-detecting and error-correcting circuits.

A common technique for error-detection is the use of cyclic redundancy check (CRC) encoding as described by Andrew S. Tanenbaum in his publication *Computer Networks* published by Prentice-Hall, Inc., Engelwood Cliffs, N.J. 1981. CRC encoding requires creating a set of parity bits from the information bits desired to be transmitted at the transmitter. These parity bits are then transmitted along with the information bits to a receiver. At the receiver, the parity bits are used with the information bits to determine if a bit error has occurred. By carefully choosing the parity bits, many error patterns in either the information or parity bits are detectable.

For example, a 6-bit CRC can detect any single bit error or any odd number of bit errors in the transmitted stream. All two-bit errors in a message of length less than 31 bits can be detected as well as any single burst error of length less than 6 bits. For a burst error of length 7 bits, 96.9% of the errors are detectable. Thus, for sufficiently long CRC's, we can detect many burst errors.

Error-correction is also employed in digital radio systems. A well-known technique for error-correction uses convolutional codes as described by Andrew Viterbi and Jim Omura in their publication *Principles of Digital Communication and Coding* published by McGraw-Hill, Inc., New York, N.Y. 1979. In convolutional encoding, information bits are encoded and decoded in such a way as to "guess" bits which were destroyed in transmission. Convolutional codes are typically described by the rate of the code, its constraint length, and the parity equations.

A convolutional code having a rate of k/n, where n−k parity bits are produced for each set of k information bits, and a constraint length of K, can be implemented in a shift register of length K−1 bits. At each interval k information bits are shifted into the register, and n bits containing k information bits and n−k parity bits are produced to be transmitted. The parity bits are combinations (linear algebraic functions) of the contents of the shift register and the most recent input bit. These combinations vary, depending on the convolutional code used.

The transmitted bits are decoded at the receiver. The receiver must have information as to the code being used by the transmitter/encoder in order to decode the information. Convolutional decoding corrects errors by "guessing" the information where a bit error has occurred, based upon its past transmitted bits, since the encoded bits are derived from several adjacent information bits.

The error-correcting code attempts to remove any errors that might have been introduced by the channel. Of course, not all errors are correctable. Thus error-detecting codes are used to determine such situations so that the appropriate actions may be taken.

One technique currently employed in digital cellular radio is to use a convolutional error-correcting code in conjunction with a cyclic redundancy check code for error-detection.

SUMMARY OF THE INVENTION

A method and apparatus for digital radio communication in accordance with the invention employs convolutional error-correcting code combined with an error-detecting code to achieve improved digital transmission results. A frame of data to be transmitted is separated into key bits, critical bits, and unprotected bits. Parity bits created from the key bits, the key bits and critical bits are convolutionally encoded using a tail-biting scheme, and are then merged with the unprotected bits and transmitted to a receiver. The received data is split into the unprotected bits and convolutionally encoded bits which are trellis decoded into a predetermined number of paths, each having a metric, a plurality of parity bits, and a plurality of key bits. A path is chosen having the lowest metric and no errors in the key bits. If no such path can be found, a fatal decoding error message is created and a predetermined path is used. The final path is decoded into digital information which is used in a digital device such as a speech synthesizer.

OBJECTS OF THE INVENTION

An object of the invention is to provide a digital radio system that employs error detection and error correction and which requires a reduced transmitted bit rate for transmission quality comparable to conventional digital radio systems.

Another object of the invention is to provide a digital radio system capable of producing superior quality data transmission at a given bit transmission rate.

Another object of the present invention is to provide a digital radio system capable of producing superior quality data transmission at a given carrier frequency.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DETAILED DESCRIPTION OF THE PREFERRED EMBODIMENT

A typical prior art convolutional encoder for a rate ½ code of constraint length K=3 and connection matrix $g_1=111$ and $g_2=001$ is shown in FIGS. 1a–1i. $g_1$ and $g_2$ are multipliers of the bit positions of the shift register. Data bits to be transmitted, designated input information ($i_0$, $i_1$, $i_2$, . . . ) are placed bit by bit into a shift register 70 from the right. The bits in a first bit position 71 and a second bit position 73 comprise the state of shift register 70 at a specific instant. The third bit position 75 receives the new input bit. The bits in the shift register are shifted one place to the left as input bits ($i_0$, $i_1$, $i_2$, . . . ) are inserted from the right, with the leftmost bit being shifted out of the shift register 70.

Two convolved bits, $P_1$ and $P_2$, are created from every input bit according to the scheme determined by the connection matrix. Bit $P_1$ is calculated using $g_1$ and bit $P_2$ is calculated using $g_2$. In the embodiment of FIGS. 1a–1i, $P_1$ is the least significant bit of the sum of the contents of the first, second, and third bit position 71, 73, 75, respectively, of shift register 70. $P_2$ is the contents of the third bit position 75. These convolved bits $P_1$ and $P_2$ are calculated for each bit of each data word and transmitted to a receiver.

Figure 1A:
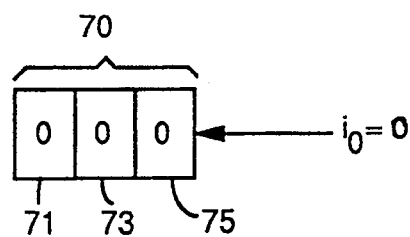
FIGS. 1a-1i illustrate a convolution sequence of a convolutional encoder for a rate ½ code having a shift register of length 3.
Figure 1B:
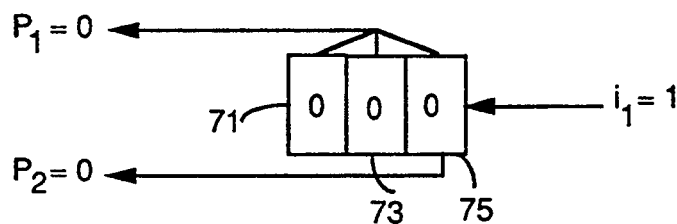
Figure 1C:
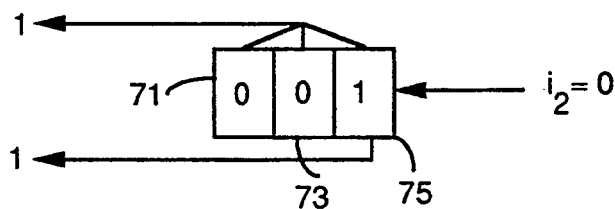
Figure 1D:
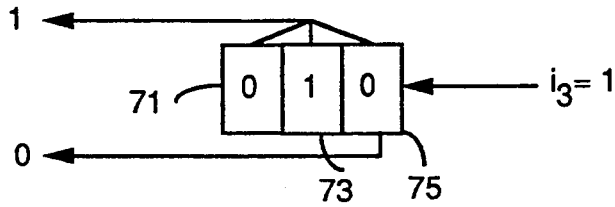
Figure 1E:
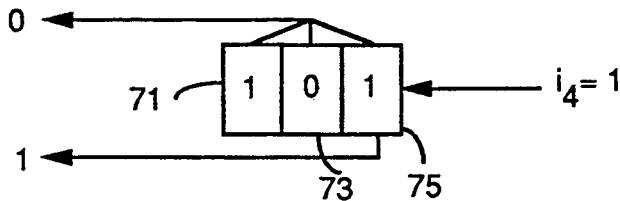
Figure 1F:
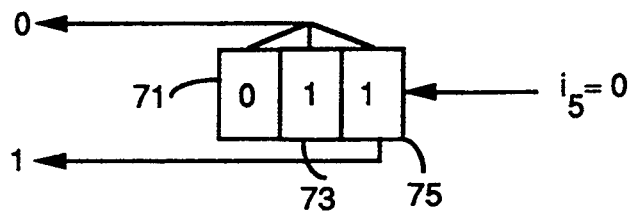
Figure 1G:
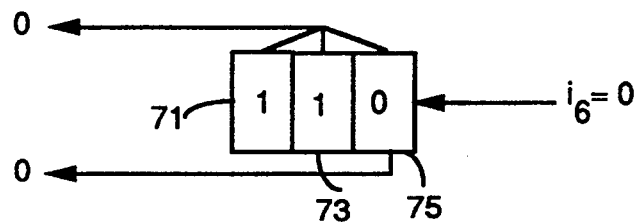
Figure 1H:
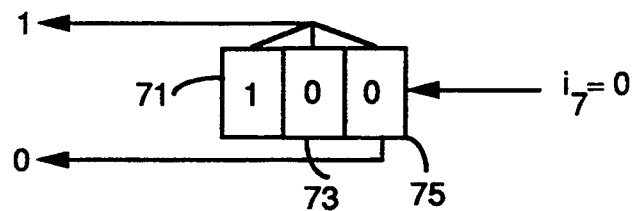
Figure 1I:
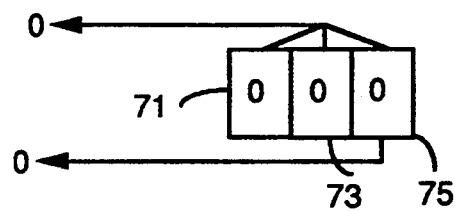

The functioning can be seen by an example. A sequence to be transmitted is 01011. The contents of the first bit position 71, the second bit position 73, and the third bit position 75 are zero in FIG. 1a. In FIG. 1b the input bit $i_1$, being "1", is shown being shifted into the third bit position 75. The zero in the third bit position 75 is shifted to the second bit position 73, as shown in FIG. 1c. The output of the convolutional encoder $P_1$, $P_2$ in FIG. 1c is a 1, 1. When bit $i_2$ has been shifted into the third bit position 75, the convolutional encoder creates two output bits 1,0, as shown in FIG. 1d. This process of shifting input bits into the shift register and creating convolutionally encoded output bits proceeds until the five bits which are desired to be transmitted, 01011, have been convolutionally encoded. In FIG. 1f, a zero is shown about to be shifted into the third bit position 75. FIG. 1g shows contents of the shift register after the zero is shifted into the third bit position 75. Two more zero input bits are similarly shifted into shift register 70 in order to clear the shift register, setting it back to its original state as shown in FIG. 1a. FIG. 1i shows the contents of the shift register after the three zero input bits have been shifted into it. The state of the shift register in FIG. 1i now is the same as the initial state of the shift register as shown in FIG. 1a.

Figure 2:
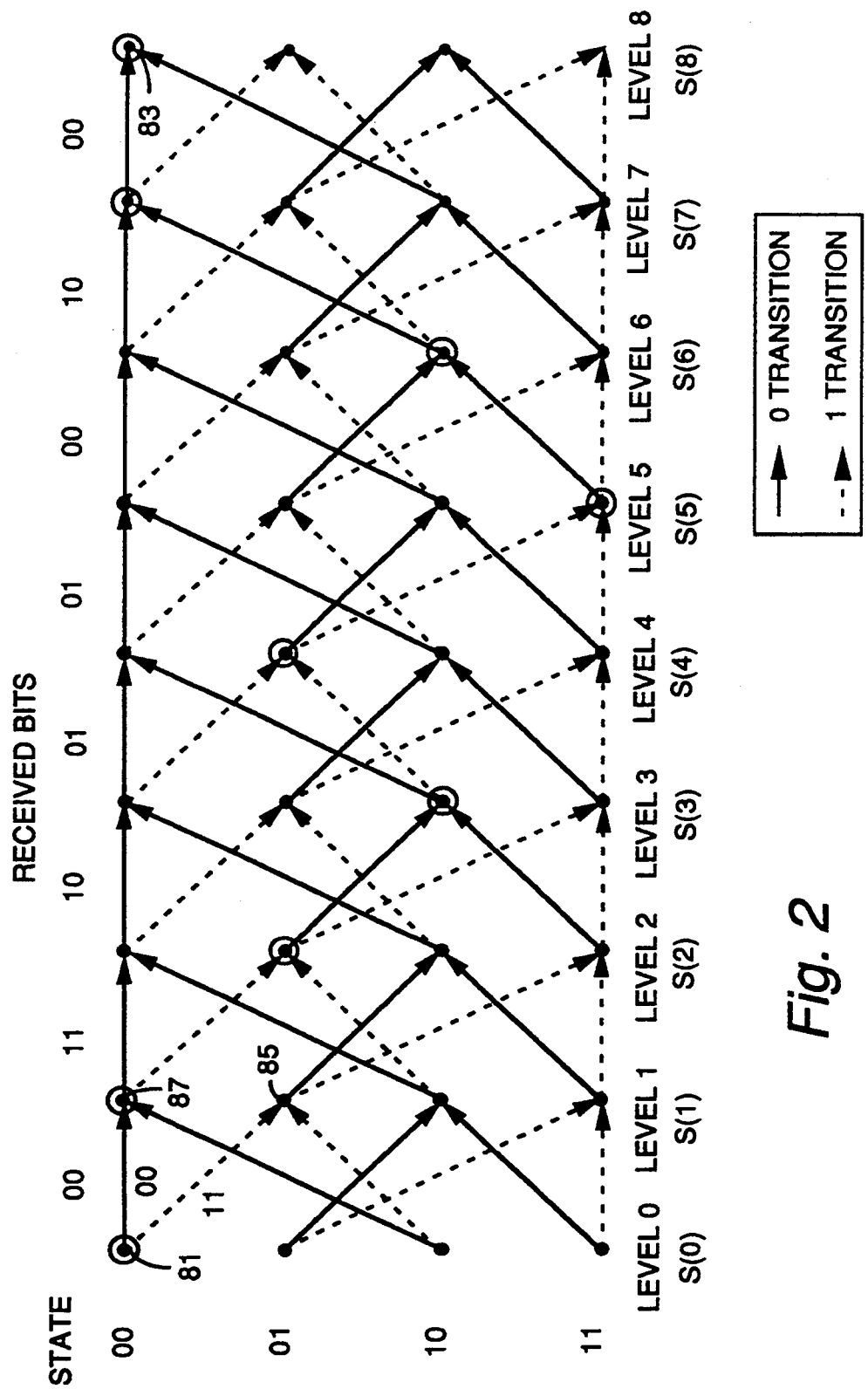
FIG. 2 is a trellis diagram for decoding information of convolutional encoder of FIGS. 1a-1i.

Trellis decoding is one method of decoding information that was convolutionally encoded. The object of trellis decoding is to determine the original bits fed to the convolutional encoder. In order to determine the original information bits, the states of the convolutional encoder shift register must be known at each interval during the encoding process, as shown in FIG. 2.

In conventional encoding, the initial state, S(0), of the shift register (level 0 of the trellis) is zero S(0)=00, before the input information is shifted into the shift register, as shown by the circled node 81. After the a data word is sent and before sending the next data word, a number of zero input bits are sent to clear the shift registers as shown in FIGS. 1f, 1g, and 1h. This causes the state of the shift register to be zero as shown in FIG. 1i after a data word is sent, also called the final state. This corresponds to S(8)=00 of level 8 at the circled node 83 of FIG. 2. The final state 83 of the shift register is therefore set to the same state as the initial state 81, both being zeros. Therefore, the initial and final states of the shift register are known in conventional convolutional encoding before any decoding begins.

All that needs to be determined now for each word of data are the intervening convolutional encoder shift register states S(k) where k=2,3,4,5,6 and 7 in the present embodiment. The receiver must know before being able to decode what the convolutionally encoded bit would be for a transmitted "1 ∞ (one transition bits) and a transmitted "0" (zero transition bits) at each level assuming that no bit errors occurred. The intervening states are determined by starting at a shift register state and comparing a set of received convolutionally encoded bits to the zero and one transition bits.

For example, beginning at a starting state of 00 node 81 the received bits 00 are compared to the zero transition bits and the one transition bits. The zero transition bits for this node would be 00 and the one transition bits for this node would be 11. A zero transition would keep the state of the shift register the same while moving from node 81 to node 87. A one transition would move through the trellis from node 81 to node 85, making the final state 01. The bit errors between the received bits 00 and the zero transition bits 00 results in no estimated bit errors, and the bit errors between the received bits 00 and the one transition bits 11 result in two estimated bit errors. The estimated bit errors, called a metric, are saved for a set of transitions through the trellis. The set of these transitions and associated metrics is called a "path". The metric for a transition from node 81 to node 87 and node 81 to node 85 are stored as two separate paths. The resulting final state is stored for each path and used at the initial state for the next possible transition.

The process of determining the metrics between the received bits and the one and zero transition bits and of determining the ending state and storing the information, relates to a single node of the trellis. This process is repeated for all possible nodes of all possible paths.

As these nodes are processed, the metrics are accumulated for each path. The path having the lowest metric and the correct initial and final states signifies the correct path.

The decoder of choice for convolutional decoding is the Viterbi algorithm (VA). The VA performs the task of error correction by an efficient search of the best path in a trellis of all possible transmitted sequences. The Viterbi Algorithm is described by G. D. Forney, Jr in "The Viterbi Algorithm", *Proc of the IEEE*, Vol. 61, pages 268–278, 1973. In the standard implementation using the Hamming distance as the metric, all the initial metrics are set to "infinite" values, except for the all-zeros state. By doing so, the trellis search is biased in favor of a particular starting state which is already known. The trellis is searched for the best path starting from the zero state, and the path map indicates the decoded data.

The generalized Viterbi algorithm (GVA) enhances the standard Viterbi algorithm by utilizing the second best path, third best path, etc., to decode the convolutionally encoded bits. This is described by N. Seshadri and C. E. W. Sundberg in "Generalized Viterbi Algorithms for Error Detection with Convolutional Codes", *IEEE Global Telecommunications Conference,* Dallas, Tex., Nov. 27–30, 1989, pages 1534–1538. These additional paths give alternative decodings if the best path should give less than desired performance.

The bits used to zero the convolutional shift register after a data word is sent are called tail bits. These tail bits are a source of inefficiency which can be eliminated by using tail-biting. A discussion of tail-biting is given by Howard Ma and Jack Wolf entitled "On Tail Biting Convolutional Codes", *IEEE Trans. on Commun.* COM-34, pages 104–111 Feb. 1986 and by Qiang Wang and Vijay Bhargava entitled "An Efficient Maximum Likelihood Decoding Algorithm for Generalized Tail Biting Convolutional Codes Including Quasi-cyclic Codes", *IEEE Trans. on Commun.,* COM-35, pages 875–879, Aug. 1989. In a tail-biting scheme of convolutional encoding, the shift register is initialized with the first $K-1$ information bits. The encoding proceeds as in conventional convolutional encoding except that the first $K-1$ bits are skipped, and $i_K, i_{K+1}, \ldots, i_L$ are encoded next. When all L information bits have been encoded, the first $K-1$ information bits are sent in again. Thus, the set of bits sent to the encoder is the following sequence $i_K, i_{K+1}, \ldots, i_L, i_0, i_1, \ldots, i_{K-1}.$ This returns the shift register to the same state as before, but only L bits are encoded. This can be easily visualized by placing the L information bits in a circular buffer. Table 1 shows the encoder output for the given input bits when tail-biting is and is not used, for the shift register using the same coding scheme as FIGS. 1a–1i.

TABLE 1

| Input | Encoder Output | |
|---|---|---|
| | No tail-biting | Tail-biting |
| 01011 | 00,11,10,01,01 | 10,01,01,01,10 |

Figure 3A:
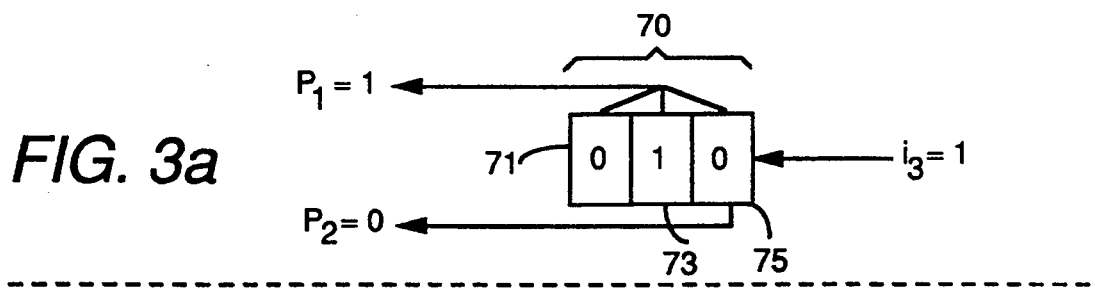
FIGS. 3a-3f illustrate a convolution sequence employing a tail-biting scheme of a convolutional encoder for a rate ½ code having a shift register of length 3, according to the present invention.
Figure 3B:
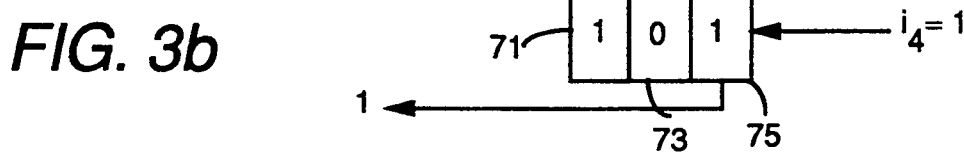
Figure 3C:
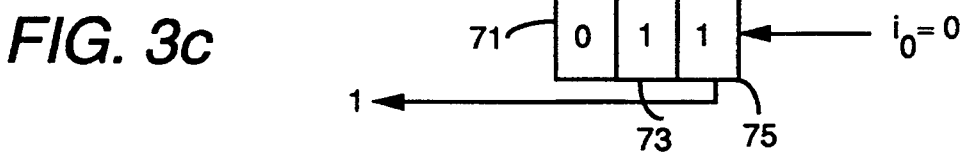
Figure 3D:
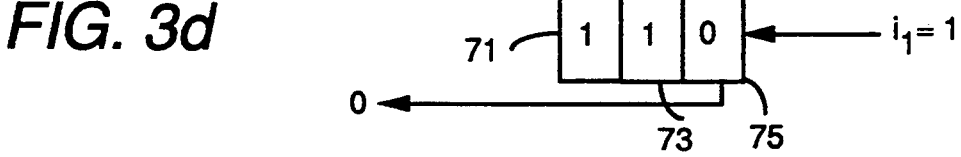
Figure 3E:
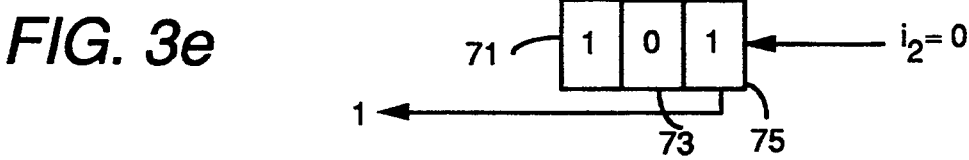
Figure 3F:
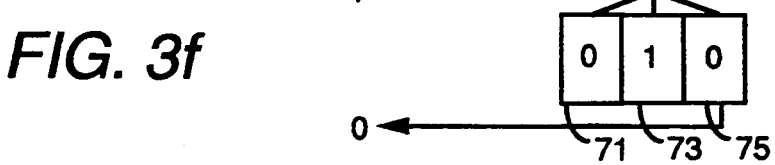

Using the same coding scheme as that of FIGS. 1a–1i, the same information bits 01011 are convolutionally encoded with tail-biting. Initially, as shown in FIG. 3a input bits $i_0$, $i_1$ and $i_2$ are placed in shift register 70 and the first bit position 71, the second bit position 73, and the third bit position 75, respectively. As input bit $i_3$ is shifted into the third bit position 75, the shift register produces bits $P_1$ and $P_2(1,0)$. In FIG. 3b, information bit $i_4$ is shown being shifted into shift register 70. In FIG. 3c, information bit $i_0$ is shown being shifted into shift register 70, followed by information bits $i_1$ and $i_2$ in FIGS. 3d and 3e, respectively. After information bit $i_2$ has been shifted into shift register 70, the state of shift register 70 is 01, as shown in FIG. 3f. The final state of shift register 70 shown in FIG. 3f is the same as the initial state of shift register 70 as shown in FIG. 3a.

At the decoder, the initial state of the trellis is not known when tail-biting is used. The trellis is essentially searched for each possible starting state using the standard Viterbi algorithm according to Howard Ma and Jack Wolf's publication and Qiang wang and Vijay Bhargava's publication above. This can be done by initializing the initial path metrics to "infinity" except for the desired initial state.

However, in our application, the complexity of this is too great. With a 16-state trellis, we would need to run the Viterbi algorithm 16 times. Instead, the initial metrics are not biased in favor of any particular state. The standard Viterbi decoder is used to find the path with the best metric. Because of the tail-biting, the initial state of the trellis will be the same as the final state, for an error-free channel. Thus, the path with the best metric also tells us what the final and initial states of the encoder should be.

Figure 4:
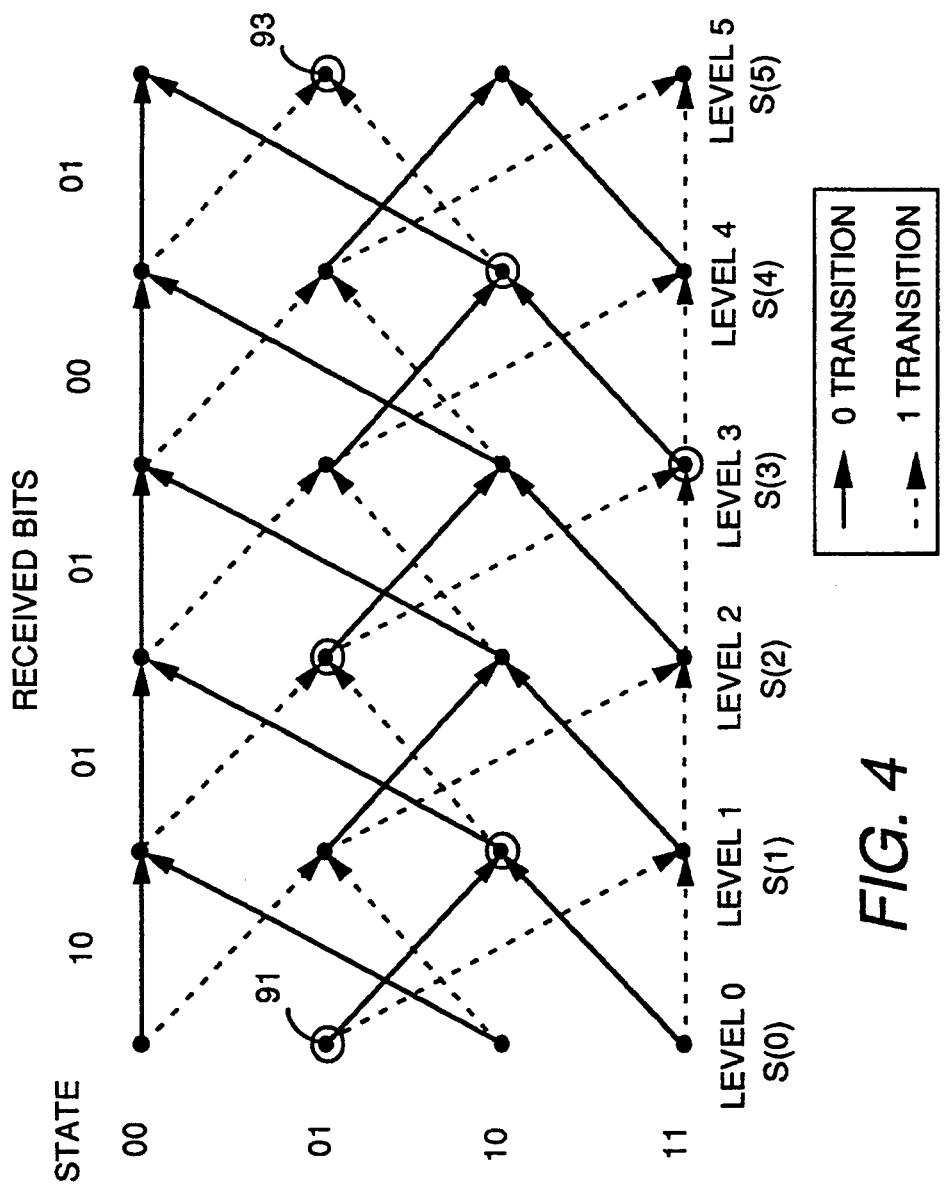
FIG. 4 illustrates a trellis diagram for decoding information of convolutional encoder of FIGS. 3a-3f.

FIG. 4 shows the trellis used in decoding the five information bits which were convolutionally encoded using tail-biting. The initial state $S(0)$, and final state $S(5)$ of the trellis were found to be 01 as shown as nodes 91 and 93 in FIG. 4. These initial and final states were calculated initially using a method such as the Viterbi algorithm. The circled nodes in FIG. 4 corresponding to each level of the trellis are the best matches between the received bits and the bits representing transitions between states. Following the path starting at node 91 and ending at node 93, the decoded sequence is 01101. Further arrangement of the received decoded sequence is required in order to arrive at the original information bits.

To decode the bits, we search the trellis for the path with the best metric. Let this best path pass through a state $S(k)$ at a $k^{th}$ level of the trellis. When backtracking the best path from state $S(L-1)$, we return to the first level of the trellis to state $S(0)$. This is an estimate of the initial state of the encoder, because of the tail-biting. This initial state indicates what the first information bits were and should also be the final state of the encoder, i.e., $S(0)=S(L-1)$ for an error-free channel.

However, if errors have occurred, we may have $S(0) \neq S(L-1)$. In this case, $S(0)$ tells us what the initial state of the encoder was, and we use that to produce the first few information bits. To determine the remaining information bits, we backtrack again, but this time from the path that terminates in state $S(0)$ at level $L-1$ of the trellis. Backtracking from this state produces the decoded sequence of the remaining information bits. The last $K-1$ bits are ignored because they are not reliable and because they can be estimated from the initial state found earlier.

One problem with this technique is that the last few decoded bits are generally not very reliable. Also, the first bit placed in the shift register only affects the current output symbol because it is immediately shifted out when the next bit comes in. These two effects cause the estimate of the initial bits of the sequence to be rather poor.

The decoding process can be enhanced by noting the periodic nature of the coded stream. At the encoder, we treat the information bits as an infinite repetition of the same block of bits. Thus, the output must also be periodic. Taking advantage of this periodicity, we extend the trellis from the usual L levels to $L+E$ levels. These extra E levels are just a periodic extension of the parity bits. Typically, $E=3K$, or $E=4K$.

The trellis is searched for $L+E$ levels to find the best path. However, we only need to backtrack L levels. The trellis state at that point is an estimate of the state at level $L+E$, $S(L+E)$. As before, this state tells us what some of the information bits were, and we use the state as the final state and backtrack L levels again to tell us what the remaining bits were. By doing this, we get a reliable estimate of the state and the remaining information bits.

The present invention combines the tail-biting scheme discussed above with the generalized Viterbi algorithm. The scheme is a simple two-stage process. First, the standard tail-biting scheme is used to find an estimate of the best initial state. This requires running either of the above Viterbi algorithms with tail-biting.

The second stage uses the GVA. From the first stage, we know what the initial and final states of the trellis should be. The GVA is run over the trellis by initializing all metrics to infinity except for the initial starting state found in the previous step. We want to perform the trellis search starting from our best guess at the initial state.

One difficulty with the method described above is the need to run the VA and the GVA to perform the decoding. This essentially doubles the number of operations required. One technique to overcome this complexity problem is to use the GVA only over a small part of the encoded symbols. In particular, assume that the outer error-detecting code only protects the first few information bits. Presumably, these bits are much more important than the others. Then we can use the GVA over just these symbols to select a path that has no detected errors. The rest of the trellis can then be decoded using the standard VA. This can significantly reduce the number of operations required.

Figure 5:
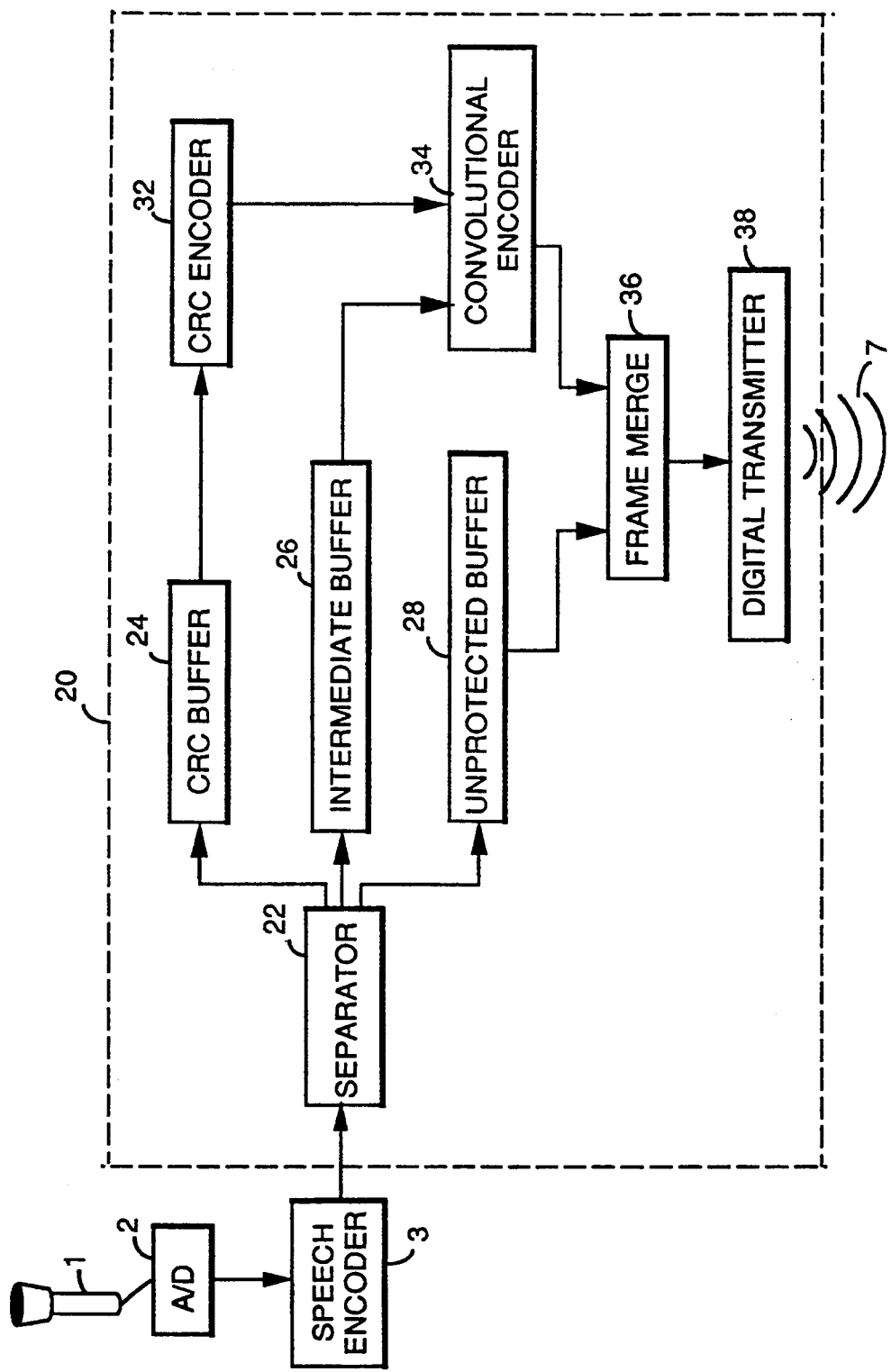
FIG. 5 is a block diagram of a transmitter of the present invention.
Figure 6:
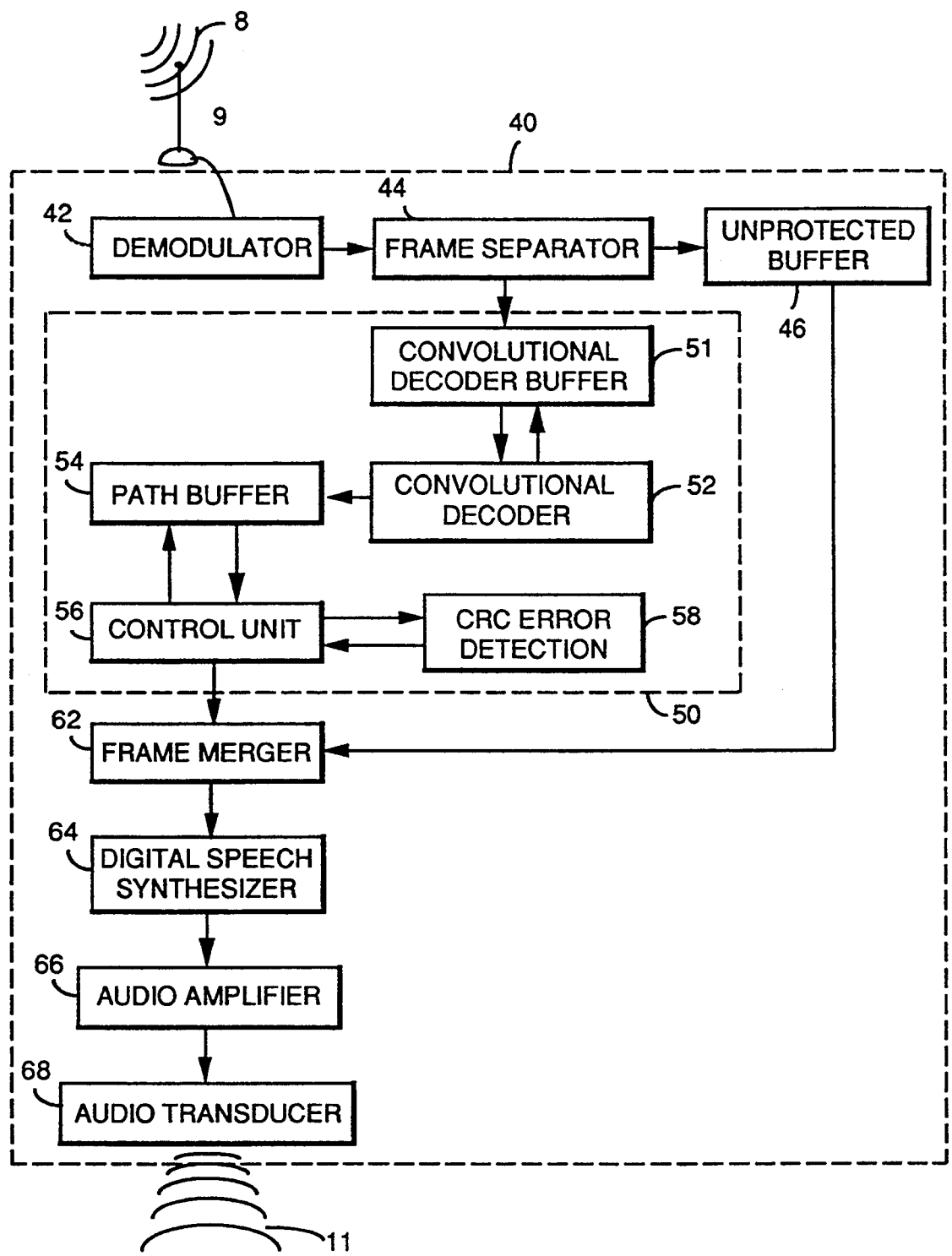
FIG. 6 is a block diagram of a receiver of the present invention.

The invention is implemented on the apparatus shown in FIGS. 5 and 6. As shown in FIG. 5, a signal to be transmitted from a source, such as a microphone 1, is sampled by an analog to digital (A/D) converter 2. The A/D converter 2 creates a digital signal that is analyzed by a speech encoder 3 to create an encoded digital signal. The encoded digital signal is passed to a separator 22 which splits the signal, comprised of frames, into the most significant bits of the frame and places them in a CRC buffer 24, the intermediate significant bits and places them into an intermediate buffer 26, and the least significant bits of the frame and places them into an unprotected buffer 28. The bits placed in CRC buffer 24, referred to as the key bits, are passed to a CRC encoder 32 which creates parity bits that are added to the key bits and fed to a convolutional encoder 34. The bits in the intermediate buffer 26, referred to as critical bits, are also passed to the convolutional encoder 34 which combines these bits with the parity and key bits from CRC encoder 32. Convolutional encoder 34 encodes the bits that are received and passes the convolutionally encoded bits to a frame merger 36. Frame merger 36 receives the output of convolutional encoder 34 and the least significant bits placed in unprotected buffer 28, referred to as unprotected bits, and merges them into a frame of data to be sent to digital transmitter 38. Digital transmitter 38 creates a frequency (RF) signal 7 having the digital information encoded in it.

As shown in FIG. 6, the transmitted RF signal is received at an antenna 9 of a receiver 40. The received signal 8 differs from the transmitted signal 7 (FIG. 5) in that the received signal 8 also includes noise introduced during transmission. A demodulator 42 receives the signal from antenna 9, demodulates it and passes the signal to a frame separator 44. The frame separator separates the received digital signal into convolutionally encoded bits and unprotected bits. The unprotected bits are stored in an unprotected buffer 46. The convolutionally encoded bits are passed to a decoder circuit 50. The decoder circuit 50 is comprised of a convolutional decoder buffer 51, a convolutional decoder 52, a path buffer 54, a control unit 56 and a CRC error detection circuit 58. The convolutionally encoded bits are stored in the convolutional decoder buffer 51. The convolutional decoder 52 processes the convolutionally encoded bits in convolutional decoder buffer 51 to produce a number of paths with an associated estimated bit error count referred to as a metric. The paths and metrics are stored by the convolutional decoder in the path buffer 54. The control unit 56 chooses the path having the best metric (fewest errors) and passes the key bits of that path and the parity bits associated with the key bits to the CRC error detection circuit 58. The CRC error detection circuit 58 determines if there has been an error in the parity bits or the key bits. The CRC error detection circuit 58 returns a message to the control unit signifying if an error has occurred. Based on the response from the CRC error detection circuit 58, control unit 56 selects the proper path from path buffer 54 and decodes the path for the information bits. The information bits are passed to a frame merge circuit 62 from control unit 56 and the unprotected bits are sent to frame merge circuit 62 from unprotected buffer 46. Frame merge circuit 62 merges the bits it receives into digital frames which may then be used in any type of digital processing device. The digital frames may also be converted to analog signals to be used by analog processing devices. In the embodiment shown in FIG. 6, a digital speech synthesizer circuit 64 receives the digital frames and synthesizes a speech signal which is passed to an audio amplifier 66 and audio transducer 68 to produce an audible speech sound 11.

Figure 7:
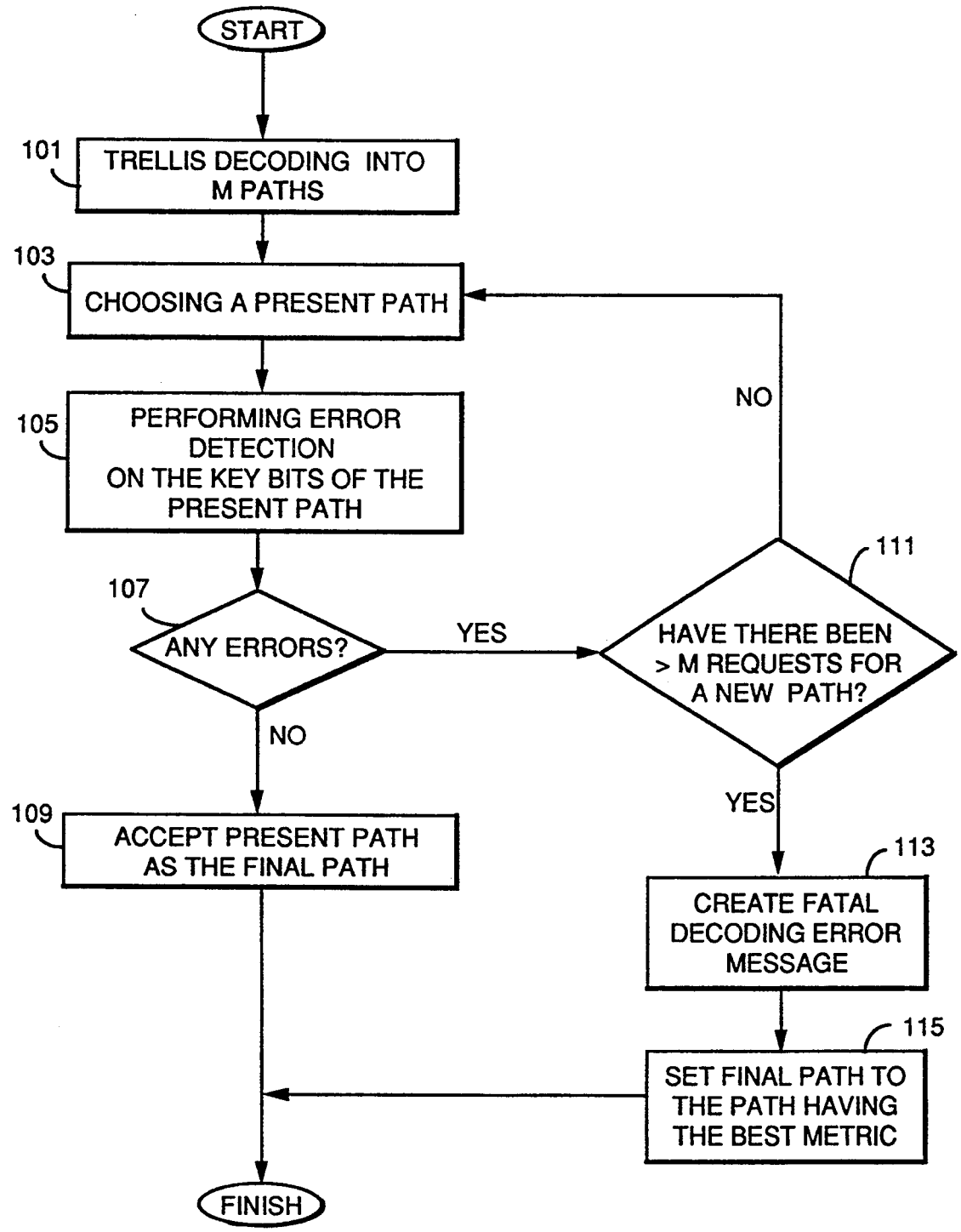
FIG. 7 is a flow chart showing the functioning of the decoding circuit of FIG. 6.

The method by which decoder circuit 50 chooses the path that is decoded for information bits is shown in FIG. 7. At step 101, M paths are created (M being a predetermined number of paths). At step 103 a present path is chosen. At step 105 the key bits of the present path and the parity bits of the present path are used to determine if a CRC error has occurred. At step 107 a decision is made as to whether any errors have been detected. If no errors have been detected, the present path is accepted at step 109. If there has been an error, a determination at step 111 is made as to whether more than M number of paths have been requested. If there have been more than M requests for a new path, all paths have been exhausted without finding a path having no errors in the key bits. At step 113 a fatal decoding error message is created to send to the appropriate circuit element. Also, a default path is sent as the final path, and that path is used to decode the information bits. The default path is one of the paths previously rejected due to key bit errors. In the preferred embodiment, the path having the best metric is used as the default path.

At step 111, if there has been less than, or just as many as M requests for a new path, the processing continues at step 103. The path having the next best metric is chosen, making sure not to choose any paths that have previously been processed. The processing continues at step 105 and is iteratively repeated until a path is accepted as the final path at steps 109 or 115. This final path is used to decode the information bits.

This generalized Viterbi algorithm with tail-biting has been implemented in real-time on a single TMS320C30 chip for the GE-Ericsson Japanese Digital Cellular Radio. In this case, a 5-bit CRC is used as the outer error-detecting code to protect 15 bits of speech data. The inner error-correcting code is a rate $\frac{1}{2}$, constraint length 5 (16 states) convolutional code. A total of 45 bits (L=45) are protected with this code (including the 5 bits for the CRC).

For this particular code, the basic Viterbi algorithm with tail-biting requires approximately 3.9 million instructions per second (MIPS) to run. The GVA with tail-biting (E=12) for this same code required 7.5 MIPS, almost double the requirements for just the VA. In addition, informal listening tests showed that this algorithm gave improved perceptual quality over the standard Viterbi algorithm.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What we claim is:

1. A method of decoding L information bits convolutionally encoded in a tail-biting scheme and transmitted with each transmitted bit corresponding to a state transition, comprising the steps of:
   a) sequentially receiving the L received bits from a beginning bit to an end bit;
   b) extending the L received bits by copying E bits from the beginning of the L received bits to the end resulting in L+E received bits;
   c) constructing a trellis diagram having a L+E stages each stage having a plurality of states, with stages pertaining to consecutive time periods and also pertaining to bits received during those time periods;
   d) determining a set of connected state transitions, known as a path, through the trellis up to stage L+E which has a state at an initial stage which is equal to a state at a final stage;
   e) determining a path metric associated with the path;
   f) repeating steps "d"–"e" for a plurality of paths and path metrics;
   g) determining a path which most closely correspond to the L+E received bits indicated by the associated path metric;
   h) determining a most likely path being a set of connected state transitions through the trellis up to stage L+E which most closely correspond to the L+E received bits, and also has a state at an initial stage which is equal to a state at a final stage;
   i) tracing back the most likely path through L levels to arrive at the state x of stage E;
   j) selecting a path which ends at state x of stage L+E, known as xpath;
   k) tracing back along xpath for E levels to end on state y at stage L, state y being a more reliable state than the state at stage L+E, state y is the most likely initial state and also being the most likely final state;
   l) determining a predetermined number of candidate paths and associated path metrics for the L+E received bits each initialized with the most likely initial state and the most likely final state;
   m) decoding a selected candidate path into decoded information bits; and
   n) utilizing the decoded information bits to produce a desired output.

2. The method of claim 1 wherein the step of decoding a selected candidate path into decoded information bits comprises:
   a) decoding a candidate path which has a path metric indicating it is closest to the received bits which not yet been decoded, into key bits and and corresponding parity bits;
   b) execute a parity check on the key bits employing the parity bits, and
      1. employing the key bits as decoded information bits if the parity check indicates an acceptable number of errors; or
      2. repeating steps "a" and "b" for a predetermined number of candidate paths;
   c) performing a fatal decoding sequence if no candidate paths exhibit an acceptable number of errors after a parity check has been performed on the predetermined number of candidate paths.

3. The method of of claim 1 wherein the step of determining a predetermined number of candidate paths comprises performing a Generalized Viterbi Algorithm (GVA) on the received bits.

4. The method of claim 1 wherein the step of utilizing the decoded information bits to produce a desired output comprises the steps of:
   a) converting the decoded information bits to an analog signal;
   b) amplifying the analog signal; and
   c) driving an audio output device with the amplified audio signal.

5. The method of claim 1 wherein the step of performing a fatal decoding error sequence comprises the steps of:
   a) creating a message that a fatal decoding error has occurred; and
   b) replacing the present path with the most likely path regardless of errors detected.

* * * * *